(12) United States Patent
Kemper et al.

(10) Patent No.: US 10,018,925 B2
(45) Date of Patent: *Jul. 10, 2018

(54) LITHOGRAPHIC APPARATUS, DRYING DEVICE, METROLOGY APPARATUS AND DEVICE MANUFACTURING METHOD

(71) Applicant: ASML NETHERLANDS B.V., Veldhoven (NL)

(72) Inventors: Nicolaas Rudolf Kemper, Eindhoven (NL); Nicolaas Ten Kate, Almkerk (NL); Joost Jeroen Ottens, Veldhoven (NL); Marcel Beckers, Eindhoven (NL); Marco Polizzi, Eindhoven (NL); Michel Riepen, Veldhoven (NL); Anthonie Kuijper, Best (NL); Koen Steffens, Veldhoven (NL); Adrianes Johannes Baeten, Eindhoven (NL); Anca Mihaela Antonevici, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/452,445

(22) Filed: Mar. 7, 2017

(65) Prior Publication Data

US 2017/0192365 A1 Jul. 6, 2017

Related U.S. Application Data

(63) Continuation of application No. 14/498,883, filed on Sep. 26, 2014, now Pat. No. 9,606,429, which is a
(Continued)

(51) Int. Cl.
*G03B 27/52* (2006.01)
*G03B 27/58* (2006.01)
(Continued)

(52) U.S. Cl.
CPC ..... *G03F 7/70866* (2013.01); *B01D 19/0021* (2013.01); *G03F 7/70341* (2013.01)

(58) Field of Classification Search
CPC ............ B01D 19/0021; G03F 7/70341; G03F 7/70866
See application file for complete search history.

(56) References Cited

U.S. PATENT DOCUMENTS 4,509,852 A 4/1985 Tabarelli et al.
6,004,386 A 12/1999 Grisham et al.
(Continued)

FOREIGN PATENT DOCUMENTS

EP 1 420 300 5/2004
JP 2005-191344 7/2005
(Continued)

OTHER PUBLICATIONS

U.S. Official Action dated Oct. 2, 2014 in corresponding U.S. Appl. No. 12/543,011.

*Primary Examiner* — Deoram Persaud
(74) *Attorney, Agent, or Firm* — Pillsbury Winthrop Shaw Pittman LLP

(57) ABSTRACT

An immersion lithographic apparatus is described in which a two-phase flow is separated into liquid-rich and gas-rich flows by causing the liquid-rich flow to preferentially flow along a surface.

21 Claims, 7 Drawing Sheets

Related U.S. Application Data continuation of application No. 12/543,011, filed on Aug. 18, 2009, now Pat. No. 8,953,142.

(60) Provisional application No. 61/136,216, filed on Aug. 19, 2008.

(51) Int. Cl.
*G03B 27/60* (2006.01)
*G03F 7/20* (2006.01)
*B01D 19/00* (2006.01)

(56) References Cited

U.S. PATENT DOCUMENTS

| | | |
|---|---|---|
| 7,804,577 B2 | 9/2010 | Leenders et al. |
| 8,432,531 B2 | 4/2013 | Hoekerd et al. |
| 8,730,447 B2 | 5/2014 | Bruijstens et al. |
| 8,937,703 B2 | 1/2015 | Sato |
| 9,494,870 B2 | 11/2016 | Sato |
| 9,507,265 B2 | 11/2016 | Sato |
| 2004/0136494 A1 | 7/2004 | Lof et al. |
| 2004/0207824 A1 | 10/2004 | Lof et al. |
| 2005/0225734 A1 | 10/2005 | De Smit et al. |
| 2005/0282405 A1 | 12/2005 | Harpham et al. |
| 2006/0038968 A1 | 2/2006 | Kemper et al. |
| 2006/0119809 A1 | 6/2006 | Verhagen et al. |
| 2006/0192929 A1 | 8/2006 | Verhagen et al. |
| 2007/0110213 A1 | 5/2007 | Leenders et al. |
| 2007/0195303 A1 | 8/2007 | Poon et al. |
| 2007/0252964 A1 | 11/2007 | Kohno et al. |
| 2008/0174748 A1 | 7/2008 | Nagasaka |
| 2009/0237638 A1 | 9/2009 | Nishikawara et al. |
| 2009/0268175 A1 | 10/2009 | Chibana et al. |
| 2010/0066988 A1 | 3/2010 | Bruijstens et al. |
| 2010/0097585 A1 | 4/2010 | Poon et al. |
| 2010/0134773 A1 | 6/2010 | Poon et al. |
| 2010/0283980 A1 | 11/2010 | Sato et al. |
| 2011/0080567 A1 | 4/2011 | Hoekerd et al. |
| 2011/0194084 A1 | 8/2011 | Riepen et al. |
| 2012/0013862 A1 | 1/2012 | Sato |
| 2012/0013863 A1 | 1/2012 | Sato |
| 2012/0013864 A1 | 1/2012 | Sato |
| 2012/0170007 A1 | 7/2012 | Sakai et al. |

FOREIGN PATENT DOCUMENTS

| | | |
|---|---|---|
| JP | 2007-053193 | 3/2007 |
| JP | 2014-011207 | 1/2014 |
| JP | 2014-120693 | 6/2014 |
| JP | 2014-154700 | 8/2014 |
| WO | 99/49504 A1 | 9/1999 |
| WO | 2005/064405 | 7/2005 |
| WO | 2012/008604 | 1/2012 |
| WO | 2012/008605 | 1/2012 |
| WO | 2012/008606 | 1/2012 |
| WO | 2012/008620 | 1/2012 |
| WO | 2012/011605 | 1/2012 |
| WO | 2012/011612 | 1/2012 |
| WO | 2012/011613 | 1/2012 |
| WO | 2012/091163 | 7/2012 |
| WO | 2014/014123 | 1/2014 |
| WO | 2014/057925 | 9/2016 |
| WO | 2014/057926 | 9/2016 |

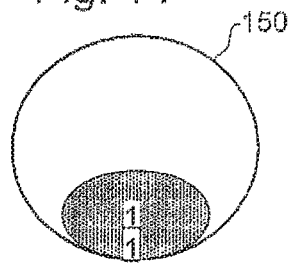
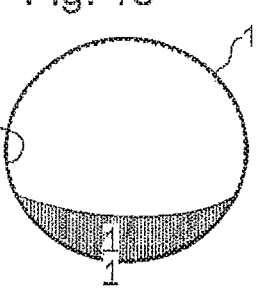
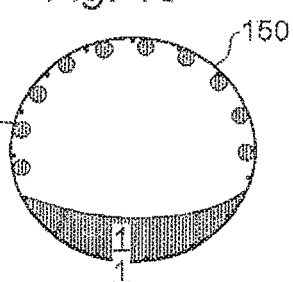
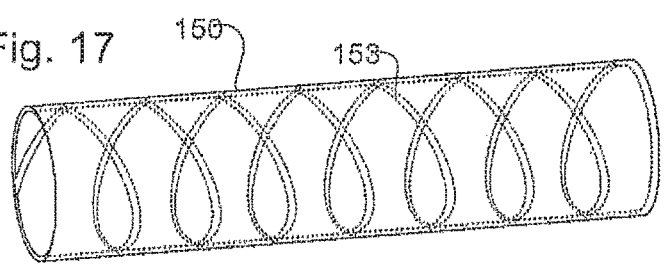
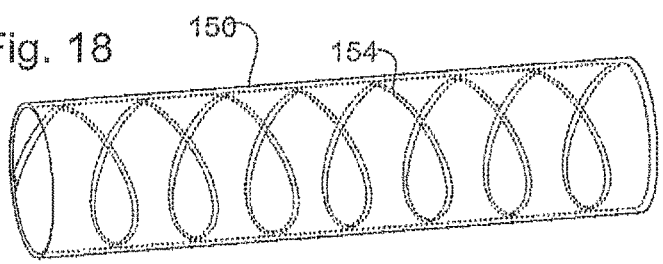
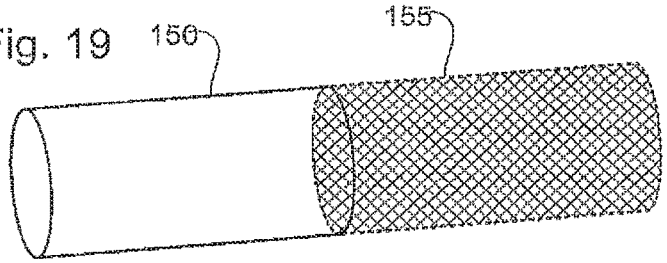
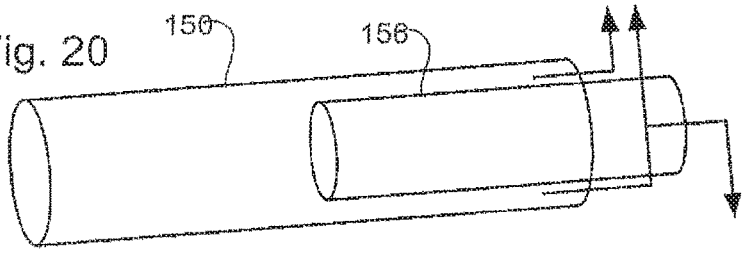

LITHOGRAPHIC APPARATUS, DRYING DEVICE, METROLOGY APPARATUS AND DEVICE MANUFACTURING METHOD

This application is a continuation of U.S. patent application Ser. No. 14/498,883 filed on Sep. 26, 2014, now allowed, which is a continuation of U.S. patent application Ser. No. 12/543,011, filed on Aug. 18, 2009, now U.S. Pat. No. 8,953,142, which claims priority and benefit under 35 U.S.C. § 119(e) to U.S. Provisional Patent Application No. 61/136,216, filed on Aug. 19, 2008, the content of each of the foregoing applications is incorporated herein in its entirety by reference.

FIELD

The present invention relates to a liquid removal device, in particular that can be used in or in conjunction with a lithographic apparatus or a metrology apparatus, as well as a method for liquid removal and device manufacture.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers and so-called scanners. In a stepper each target portion is irradiated by exposing an entire pattern onto the target portion at one time. In a scanner each target portion is irradiated by scanning the pattern through a radiation beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The liquid is desirably distilled water, although other liquids can be used. An embodiment of the present invention will be described with reference to liquid. However, another fluid may be suitable, particularly a wetting fluid, an incompressible fluid and/or a fluid with a higher refractive index than air, desirably a higher refractive index than water. Fluids excluding gases are particularly desirable. The point of this is to enable imaging of smaller features since the exposure radiation will have a shorter wavelength in the liquid. (The effect of the liquid may be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as an aromatic, e.g. Decalin, or a fluorohydrocarbon, or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion liquid is handled by a fluid handling system or apparatus. In an embodiment the fluid handling system may supply immersion fluid and therefore be a fluid supply system. In an embodiment the fluid handling system may confine fluid and thereby be a fluid confinement system. If the confined fluid is a liquid, the fluid confinement system may have a liquid confinement structure. In an embodiment the fluid handling system may provide a barrier to fluid and thereby be a barrier member. In an embodiment the fluid handling system may create or use a flow of fluid (such as gas), for example to help in handling liquid such as to confine liquid for example as a contactless gas seal. In an embodiment, immersion liquid may be used as the immersion fluid. In that case, the fluid handling system may be a liquid handling system.

One of the arrangements proposed is for a liquid handling system, such as a liquid supply system. The liquid supply system is to provide liquid on only a localized area of the substrate and in between the final element of the projection system and the substrate using a liquid confinement structure (the substrate generally has a larger surface area than the final element of the projection system). One way which has been proposed to arrange for this is disclosed in PCT Patent Application Publication No. WO 99/49504. As illustrated in FIGS. 2 and 3, liquid is supplied by at least one inlet onto the substrate, desirably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible. One example is illustrated in FIG. 3 in which four sets of an inlet with an outlet on either side are provided in a regular pattern around the final element. Note that the direction of flow of the liquid is shown by arrows in FIGS. 2 and 3.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system substantially the whole top surface of the substrate is covered in liquid. This may be advantageous because then the substantially whole top surface of the substrate is exposed to the substantially same conditions. This has an advantage for temperature control and processing of the substrate. In WO 2005/064405, a liquid supply system provides liquid to the gap between the final element of the projection system and the substrate. The liquid between the final element of the projection system and the substrate during exposure is optical liquid. That liquid is allowed to leak over the remainder of the substrate. A barrier at the edge of a substrate table prevents the liquid from escaping so that it can be removed from the top surface of the substrate table in a controlled way. The meniscus of the liquid defining the extent of the immersion liquid is remote from the projection system. Although such a system improves temperature control and processing of the substrate, evaporation of the immersion liquid may still occur. One way of helping to alleviate that problem is described in United States patent application publication no. US 2006-0119809 in which a cover member is provided which covers the substrate W in all positions. The cover member is arranged to have immersion liquid extending between it and the top surface of the substrate and/or substrate table which holds the substrate.

SUMMARY

In an immersion lithography apparatus, a two-phase flow (that is a flow of mixed liquid and gas) often arise. A two-phase flow can range from a flow in which there are droplets of liquid in a majority gas flow, to bubbles of gas in a majority liquid flow. Two-phase flow covers all possibilities in between except where the gas is dissolved in the liquid or the gas and the liquid are separate and flow side by side in an orderly manner. For example, in a localized immersion system using a gas flow and liquid extraction to stabilize the meniscus of the immersion liquid, a substantial amount of liquid is swept up and extracted with the gas of the stabilizing gas flow. A two-phase flow may cause a problem. Evaporation of the immersion liquid into the gas, if non-saturated, can cause localized cooling. Two-phase flow is often unsteady, with, for example, a large volume of liquid interspersed with the gas. Such unsteady flow can cause vibration due to the irregular movements of a large volume of liquid and due to variation in the pressure in the extraction channel. Also, designing a pump and pipework to cope with gas, liquid and variable mixtures of gas and liquid adds complication and expense.

It is desirable, for example, to provide an improved apparatus by which two-phase flow can be stabilized and/or at least substantially separated into liquid and gas flows, and desirably substantially minimized.

According to an aspect of the invention, there is provided a lithographic apparatus comprising a substrate table constructed to hold a substrate, and a fluid handling structure arranged to remove liquid and gas in a two-phase flow from a surface of the substrate table, or of a substrate held by the substrate table, or both the substrate table and the substrate. The fluid handling structure comprises a phase separator having a surface and arranged to separate the two-phase flow into a first flow and a second flow. The first flow has a higher ratio of liquid to gas than the two-phase flow and flows along the surface. The second flow has a higher ratio of gas to liquid than the two-phase flow.

According to an aspect of the invention, there is provided a fluid handling structure configured to remove liquid and gas in a two-phase flow from a surface. The fluid handling structure comprises a phase separator having a surface and arranged to separate the two-phase flow into a first flow and a second flow. The first flow has a higher ratio of liquid to gas than the two-phase flow and flows along the surface. The second flow has a higher ratio of gas to liquid than the two-phase flow. In an embodiment, a drying device comprises the fluid handling structure. In an embodiment, an immersion metrology device comprises the fluid handling structure.

According to an aspect of the invention, there is provided a device manufacturing method comprising projecting an image of a pattern onto a substrate through a liquid confined to a space adjacent the substrate. The method further comprises removing liquid from the substrate in a two-phase flow with gas, and separating the two-phase flow into a first flow and a second flow. The first flow has a higher ratio of liquid to gas than the two-phase flow and flows along a surface. The second flow has a higher ratio of gas to liquid than the two-phase flow.

According to an aspect of the invention, there is provided a liquid-gas separator comprising a conduit or chamber divided into two parts by a porous plate, the first part being substantially filled with liquid. The separator further comprises a current generator configured to supply liquid to the first part and constructed and arranged to generate a current in the liquid so as to substantially prevent bubbles of gas remaining on a surface of the porous plate which defines in part the first part. In an embodiment, a lithographic apparatus or a metrology device having an immersion system comprises the separator.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 14 depicts, in cross-section, a two-phase flow in an ordinary cylindrical tube;

FIG. 15 depicts, in cross-section, a two-phase flow in a cylindrical tube usable in an embodiment of the invention;

FIG. 16 depicts, in cross-section, a two-phase flow in another cylindrical tube usable in an embodiment of the invention;

FIG. 17 depicts in perspective a further cylindrical tube usable in an embodiment of the invention;

FIG. 18 depicts in perspective a further cylindrical tube usable in an embodiment of the invention;

FIG. 19 depicts in perspective a further cylindrical tube usable in an embodiment of the invention;

FIG. 20 depicts in perspective a further cylindrical tube usable in an embodiment of the invention.

DETAILED DESCRIPTION

Figure 1:
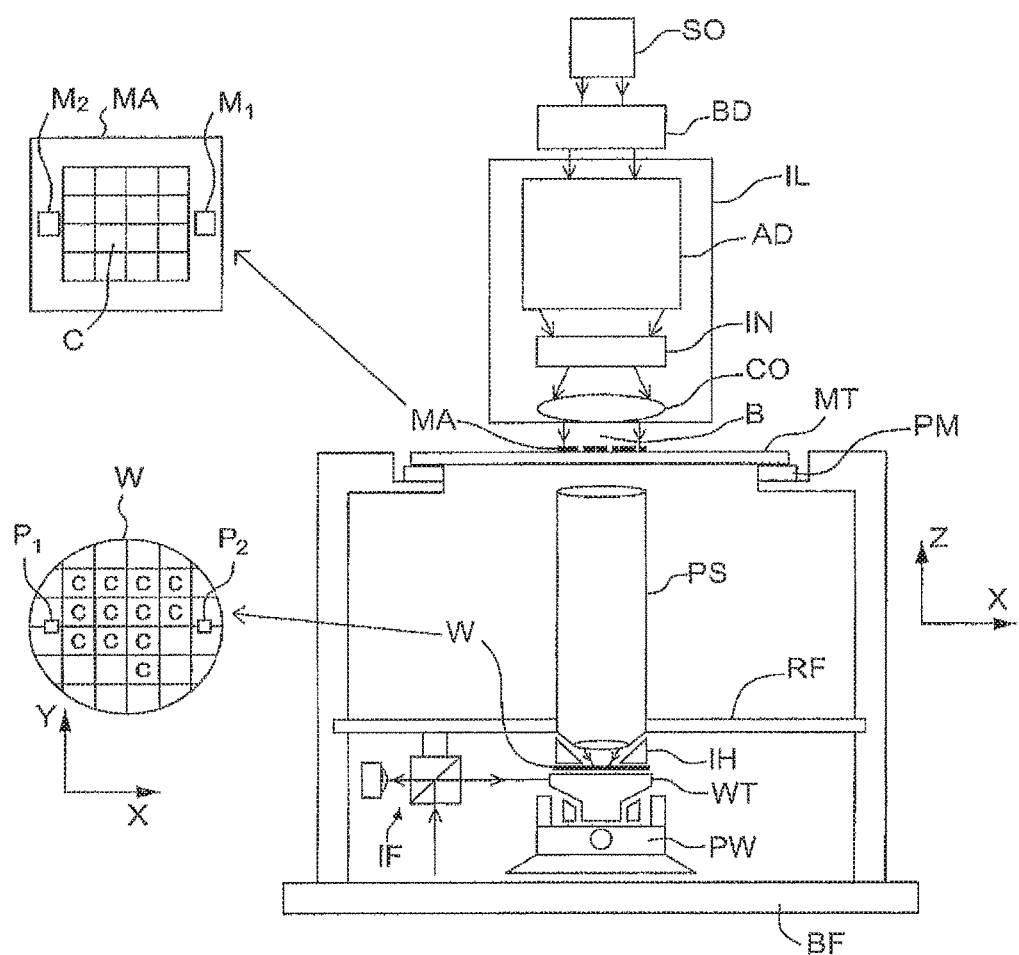
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies. A fluid handling structure IH, which is described further below, controls a localized area of immersion liquid between the projection system PS and the substrate W.

The depicted apparatus could be used in at least one of the following modes:
1. In step mode, the support structure MT and the substrate table WT are kept essentially stationary, while an-entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may be employed additionally or in the alternative.

Figure 5:
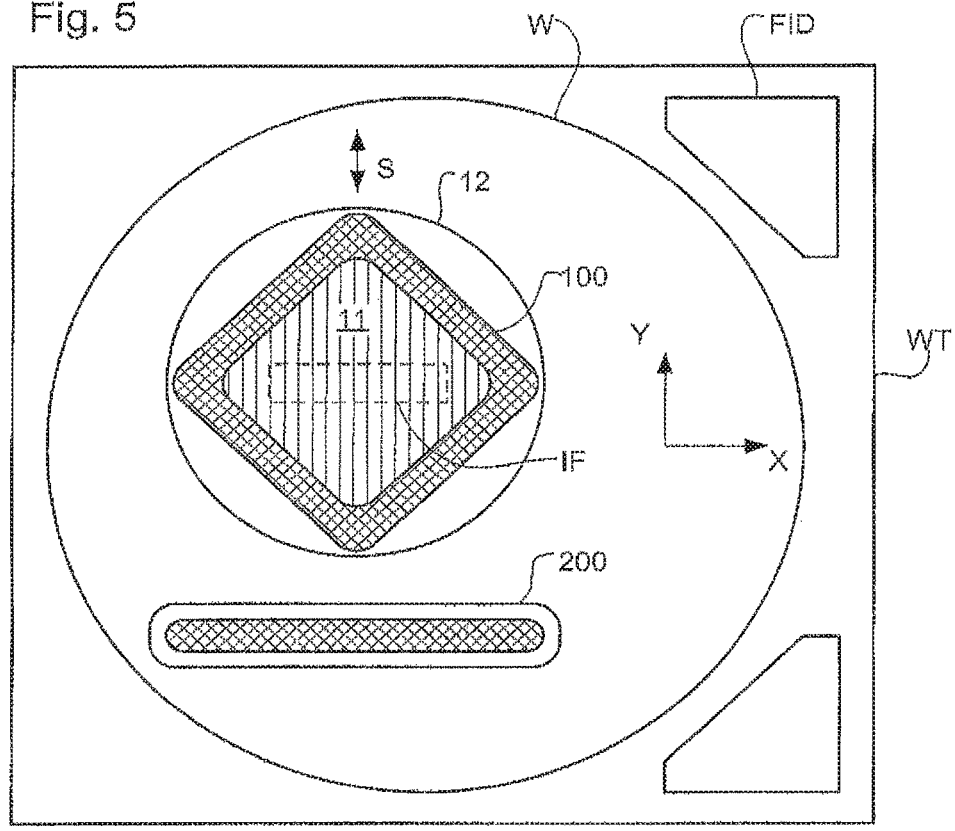
FIG. 5 depicts parts of a substrate stage in an embodiment of the invention, including a structure to handle fluid in order to control a localized area of immersion liquid on a substrate held on a substrate table and a liquid removal device to remove liquid from the substrate.

An embodiment of the present invention relates to an immersion lithographic apparatus. FIG. 5 depicts schematically, in plan, a fluid handling arrangement relative to a substrate stage in more detail. In particular, a fluid handling structure 12 is provided to supply and control immersion liquid flow in the lithographic apparatus. In an embodiment, the fluid handling structure is provided to supply and confine an immersion liquid to a space between the final element of the projections system PS (not shown in this figure) and the substrate W and/or substrate table. (Note that reference to the substrate herein includes references to the substrate table in the alterative or as an addition, unless stated to the contrary). This structure includes a liquid removal device 100 and is described further below. During the course of a series of exposures and measurements carried out on a substrate W, the substrate table WT is moved relative to the projection system PS and fluid handling structure 12 at high speeds and with high accelerations. At various times, e.g. when exposing an edge die on the substrate and when making measurements using a sensor provided in sensor block FID, the edge of the substrate may pass under the localized body of immersion liquid 11. This, and large accelerations or changes in direction of the substrate table WT, can cause a droplet or film to break away from the body of immersion liquid 11. A droplet can be left behind on the substrate, substrate table and/or sensor FID. A droplet left on the substrate can cause problems, as discussed above. The droplet may cause localized cooling and hence distortion of the substrate. A droplet may deposit dissolved or suspended contaminants and/or by attracting contaminants from the environment. Therefore, the liquid removal system 100 according to an embodiment of the invention is intended to minimize the creation of droplets left on the substrate by stabilizing the meniscus of the body of immersion liquid.

Figure 2:
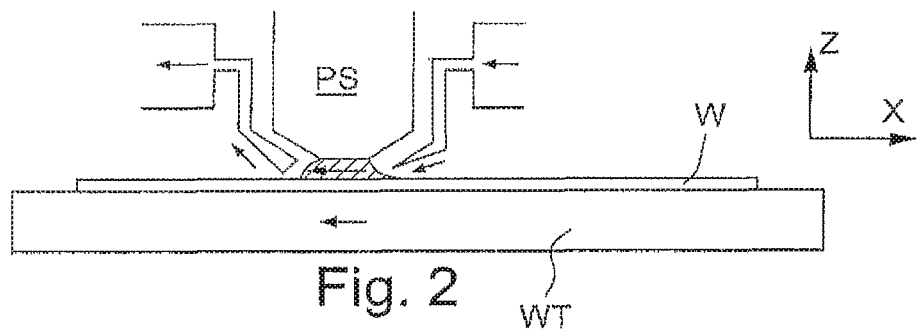
FIGS. 2 and 3 depict a fluid handling structure for use in a lithographic projection apparatus.
Figure 3:
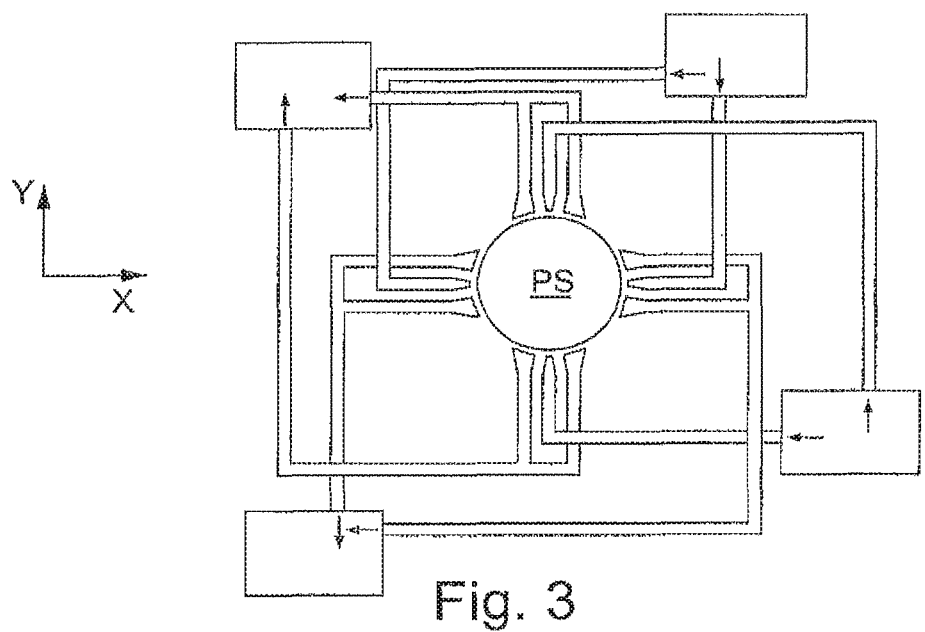
Figure 4:
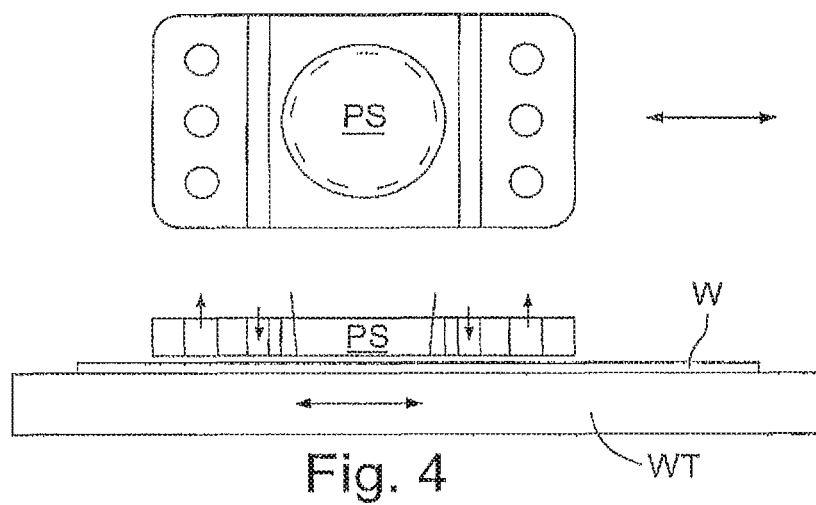
FIG. 4 depicts a further fluid handling structure for use in a lithographic projection apparatus.

An additional liquid removal device 200 according to an embodiment of the invention may be provided to remove any liquid left on the substrate W. The liquid removal device 200 may be fixed in position relative to the projection system so that the normal movement of the substrate table under the projection system during a series of exposures sweeps the substrate under it. The liquid removal device 200 may be provided with its own positioner. The liquid removal device 200 may be used when the fluid handling structure 12 does not have a liquid removal system 100 according to an embodiment of the invention. For example the fluid handling structure 12 may be of one of the types fluid handling structures depicted in FIGS. 2 to 4 and described above. Or it may be a type which uses a gas knife to confine the immersion liquid, e.g. as disclosed in United States patent application publication no. US 2004-0207824, incorporated herein by reference.

Figure 6:
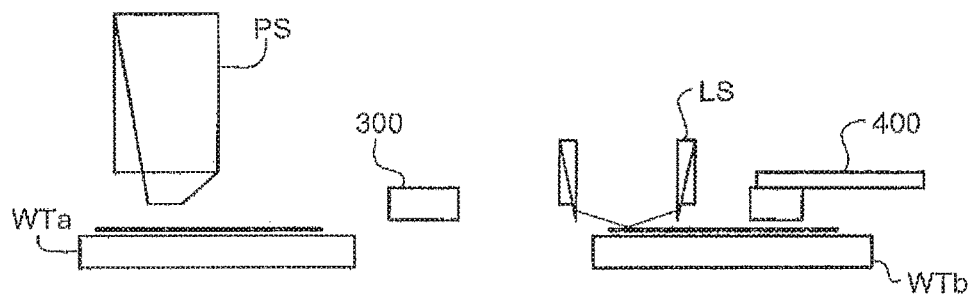
FIG. 6 depicts other arrangements in the substrate stage of a lithographic apparatus including a liquid removal device according to an embodiment of the present invention.

A liquid removal device according to an embodiment of the invention may alternatively or in addition be placed at other positions in a lithographic apparatus. For example, as shown in FIG. 6, a liquid removal device 300 may be positioned between an exposure station, at which a substrate is exposed on substrate table WTa, and a measurement station at which measurements are taken of, for example, a substrate on substrate table WTb. A measurement taken at the measurement station may be a height map of the substrate using a level sensor LS. A substrates may be loaded onto and off a substrate table at the measurement station. Liquid removal device 300 may be sufficiently large and suitably positioned so that the whole of the substrate is swept as the substrate table passes beneath it when transferring between stations. A liquid removal device 400 may be positioned at the measurement station to dry the substrate in conjunction with the taking of measurements. The liquid removal device 400 may be provided with its own positioning system. The liquid removal device may be located outside a lithographic device, for example in the track. There it would have the same features as any of the liquid removal devices 200, 300, 400 herein described.

Figure 7:
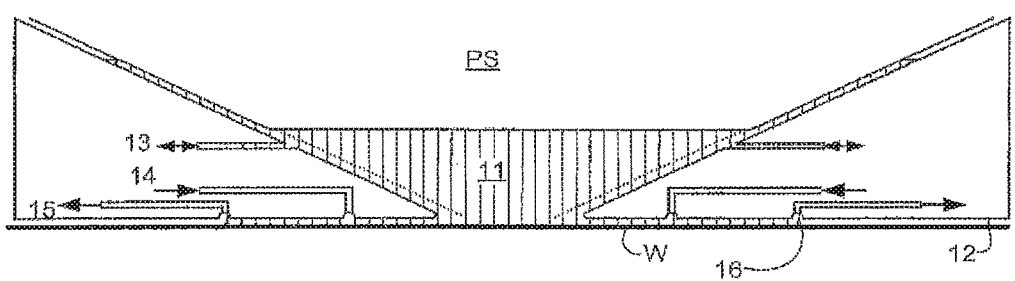
FIG. 7 depicts, in cross-section, a barrier member forming part of the fluid handling structure of FIG. 5.

Another arrangement which has been proposed is to provide a fluid handling system having a barrier member. Such an arrangement is illustrated in FIG. 7. In an embodiment, a seal is formed between the barrier member and the surface of the substrate. In an embodiment, the seal is a contactless seal such as a gas seal. The seal may confine the immersion liquid and so create a meniscus. Thus, near the seal is a meniscus of the immersion liquid. As exposure light passes through the confined immersion liquid it may be considered optical liquid.

The fluid handling structure is schematically depicted in FIG. 7. It forms part of a localized immersion system. The fluid handling structure is arranged to control, in particular to supply and to confine, immersion liquid to a space between the final element of the projection system PS and the substrate W. The main part of the fluid handling structure is a barrier member 12, which extends along at least a part of a boundary of the space between the final element of the projection system and the substrate. The barrier member 12 is, in use, substantially stationary relative to the projection system in the XY plane though there may be some relative movement in the Z direction (in the direction of the optical axis).

The barrier member 12 is a structure which may at least partly contain liquid in the space 11 between a final element of the projection system PS and the substrate W. Immersion liquid is provided via liquid supply conduit 14, i.e. it is an inlet, and fills the space between the substrate surface and the final element of the projection system. The space is at least partly delimited by the barrier member 12 positioned below and surrounding the final element of the projection system PS. Liquid may be supplied to or removed from the space via inlet-outlet 13. The barrier member 12 may extend a little above the final element of the projection system. The liquid level may rise above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery may closely conform to the shape of the image field IF, e.g., rectangular, though this need not be the case.

The liquid 11 in the space is prevented from spilling out over the whole of the surface of the substrate by liquid extraction conduit 15, forming part of liquid removal device 100. Liquid extraction conduit 15 is in fluid communication with a plurality of orifices. The orifices form liquid openings which are disposed around the space occupied by the immersion liquid. The shape and arrangement of these orifices serves to control and in particular stabilize the meniscus 16 of the immersion liquid 11 so as to reduce or minimize droplets breaking away from or bubbles entering the immersion liquid. While a plurality of orifices or openings are referred to herein, the plurality of orifices or openings may be a singular orifice or opening, which may be annular.

In an embodiment of the invention, the openings of the liquid removal device are conveniently defined by a plate that covers the lower surface of the barrier member 12 and has an appropriately shaped aperture or apertures. In an embodiment, the openings may be individual nozzles. The openings each may be co-planar with or protrude from the lower surface of the barrier member.

In localized immersion systems, liquid is only provided to a localized area of the substrate. The space 11 filled by liquid, i.e. the reservoir, is smaller in plan than the top surface of the substrate. The reservoir remains substantially stationary relative to the projection system PS while the substrate W moves underneath it. Another category of immersion system is the bath type arrangement in which the whole of the substrate W and optionally part of the substrate table WT is submersed in a bath of liquid. A further category is an all wet solution in which the liquid is unconfined. In this arrangement the whole top surface of the substrate and optionally all or part of the substrate table is covered in a thin film of immersion liquid. Any of the liquid supply devices of FIGS. 2 to 5 can be used in such a system; however, their sealing features are not present, are not activated, are not as efficient as normal or are otherwise ineffective to seal liquid to only the localized area. Other arrangements are possible and, as will be clear from the description below, an embodiment of the present invention may be implemented in any type of liquid supply system.

In an immersion lithography apparatus, substantial quantities of the immersion liquid are often extracted from the vicinity of the substrate. In doing so, it is common that gas, e.g. air from the environment, is extracted with the immersion liquid. This occurs in particular in localized fluid handling systems that use liquid extraction to pin the meniscus of the localized immersion liquid. When liquid and gas are extracted together in a two-phase flow, vibrations can be caused due to irregular flows that occur and/or because of fluctuations in the pressure at the extraction points due to that irregular flow. It is therefore desirable to separate the liquid and gas phases of a two-phase flow at least partially, and desirably as much as possible. Complete separation is often not necessary since a small proportion of gas in a liquid flow or a small proportion of liquid in a gas flow tends not to cause such undesired vibrations. Undesirable vibrations are avoided if the two-phase flow is homogeneous on the scale of the conduit, for example a "bubbly flow" of small bubbles in liquid or a "misty flow" of small droplets in gas. Partial separation is also desirable as it tends to reduce the amount of evaporation of the liquid. This in turn reduces the undesirable localized cooling caused by evaporation.

Therefore, an embodiment of the present invention provides a lithographic apparatus comprising a substrate table and a fluid handling structure. The substrate table is constructed to hold a substrate. The fluid handling structure is arranged to remove liquid and gas in a two-phase flow from a surface of the substrate table and/or a substrate held by the substrate table. The fluid handling structure comprises a phase separator having a surface and arranged to separate the two-phase flow into a first flow and a second flow, the first flow having a higher ratio of liquid to gas than the two-phase flow and flowing along the surface, the second flow having a higher ratio of gas to liquid than the two-phase flow.

By causing a high liquid content flow (also referred to as a liquid-rich flow) to flow along the surface, the two phases of the mixed two-phase flow can be separated sufficiently to reduce undesirable vibrations and uneven flow. The liquid can be encouraged to flow desirably along the surface by any one or combination of means as discussed below.

In an embodiment, the phase separator comprises a channel having first and second walls and arranged so that liquid preferentially flows along the first wall, the first wall defining the surface. The shape of the channel is designed to encourage the liquid to flow along the first wall, e.g. by providing a change in direction such that centrifugal force directs the liquid onto the first wall. Alternatively or in addition, the shape of the channel may be such as to cause cyclonic flow, directing the liquid outwardly to the wall. Another possibility is that the shape of the channel slows the two-phase flow sufficiently that the liquid separates out by or with the assistance of gravity.

In an embodiment, the first wall is more liquidphilic than the second wall. By liquidphilic it is meant that the liquid has a contact angle to the liquidphilic surface that is less than 90°, desirably less than 75°, 50°, or 25°. The surface may be made liquidphilic by any suitable surface treatment, for example a coating or by a surface relief, or may be liquidphilic by virtue of the material from which it is made. A surface relief may be a regular pattern or irregular roughness.

In an embodiment, the phase separator further comprises a wet chamber arranged so that liquid flowing along the first wall enters the wet chamber. In this way, the separation achieved at the surface can be fixed, by directing the liquid-rich flow into a chamber from which it can be removed separately from the gas-rich flow. It is desirable that the path of the liquid-rich flow is straight and/or tends downwardly.

In an embodiment, the wet chamber is connected to the channel by a slit defined by the first wall and a divider. The width of the slit can be defined by the divider so as to substantially ensure that the slit is substantially filled by the liquid-rich flow at a flow rate expected in use of the apparatus and thereby gas is kept out of the wet chamber. Also, the slit width can be chosen so that capillary forces encourage substantially only liquid to enter the slit.

In an embodiment, the phase separator comprises a dry chamber connected to the channel via an opening in the second wall. The gas can then be extracted from the dry chamber, substantially without liquid.

In an embodiment, the first wall is curved so that at a point where the channel enters the wet chamber the first wall is lower than the second wall. With this arrangement, gravity assists flow of the liquid and separation from the gas. Also, the first wall can be configured to form a dam that substantially prevents flow of the liquid back out of the wet chamber.

In an embodiment, the phase separator comprises a gas extraction channel separated from the wet chamber by a gas-permeable liquidphobic membrane. The liquidphobic membrane substantially prevents liquid entering the gas extraction channel. A suitable material for the membrane depends on the immersion liquid used. If the immersion liquid is water, a hydrophobic membrane such as a porous fluoropolymer membrane, in particular a thermo-mechanically expanded polytetrafluoroethylene (PTFE) and other fluoropolymer product sold under the "Gore-Tex" trademark, may be used.

In such an embodiment, the phase separator may comprise a liquid extraction conduit projecting into the wet chamber and having an opening below the gas-permeable liquidphobic membrane. The position of the liquid extraction conduit can be set so that substantially only liquid is extracted and separation of the liquid and gas in the wet chamber is encouraged.

In an embodiment, the phase separator comprises a drain path. The drain path allows liquid to drain from the wet chamber to a space between the substrate and a final element of a projection system arranged to project a patterned radiation beam onto the substrate. With this arrangement the immersion liquid can be directly recycled into the path of the projection beam, reducing the flow of liquid into and out of the fluid handling system.

In an embodiment, the phase separator comprises a chamber, defined by first and second walls, and a plurality of channels entering into the chamber through the second wall. The channels are arranged at an angle to the second wall such that a two-phase flow entering the chamber from a channel at least partially separates into a liquid flow along the first wall and a gas flow along the second wall. In such an embodiment, the direction of one or more channels and the shape of the chamber are each designed to encourage separation of the liquid and gas. For example, one of the channels may be configured such that the two-phase flow makes a sharp change of direction on encountering the first wall, thereby encouraging the liquid to flow along it.

In an embodiment, the phase separator further comprises a plurality of flow directing structures in the chamber adjacent the openings of the channels. The flow directing structures can have curved surfaces that define flow paths leading away from the openings, the flow paths flaring away from the openings over at least part of their length. The curved surfaces can be arranged so that the flow paths turn through at least 90°, desirable 180°. In this way the flow paths can ensure a suitable flow of the two-phase mixture to ensure that cyclonic and/or centrifugal forces cause the liquid to separate and desirably follow the first wall.

In an embodiment, the phase separator comprises a conduit having a liquidphilic surface, for example provided by a liquidphilic coating provided thereon and/or a liquidphilic surface relief provided thereon. As mentioned above, by liquidphilic it is meant that the liquid has a contact angle to the liquidphilic surface that is less than 90°, desirably less than 75°, 50°, or 25°.

In an embodiment, the phase separator comprises a conduit defined by a wall and having a substantially circular cross-section over at least a part of the length thereof and a substantially helical structure provided on the wall. The substantially helical structure can be a substantially helical groove in the wall and/or a substantially helical wire mounted on the wall. The groove and/or the wire can be provided with a liquidphilic coating. Such a helical structure promotes establishment and maintenance of a separated flow in which the liquid desirably flows along the surface of the conduit and the gas flows down the middle of the conduit. This may reduce turbulence and hence vibration.

In an embodiment, the conduit is in part defined by a wall in the form of a porous member, for example a porous plate such as a microsieve through which liquid can be extracted. Microsieves are described further below and in US patent application publication no. 2006/0038968, which document is hereby incorporated in its entirety by reference. In an embodiment, the phase separator further comprises a gas extraction conduit arranged within a part of the conduit so as to define an annular gap between an outer surface of the gas extraction conduit and an inner surface of the conduit. These arrangements enable the liquid and gas flows established around the outside and middle of the conduit to be directed into separate channels, effectively fixing the separation.

In an embodiment, the fluid handling structure comprises a barrier member arranged to at least partly confine a liquid to a space between the substrate and a final element of a projection system. The projection system is arranged to project a patterned radiation beam onto the substrate. The phase separator is contained in the barrier member. By providing the separator in the barrier member, separation of the two phases can be effected as close as possible to the point(s) where the two-phase flow is taken up. In this way, the occurrence of vibration may be minimized as much as possible.

An embodiment of the present invention also provides a fluid handling structure configured to remove liquid and gas in a two-phase flow from a surface. The fluid handling structure comprises a phase separator having a surface and arranged to separate the two-phase flow into a first flow and a second flow. The first flow has a higher ratio of liquid to gas than the two-phase flow and flows along the surface. The second flow has a higher ratio of gas to liquid than the two-phase flow.

The fluid handling structure may be used in a drying device (which may also be referred to as a dryer) or an immersion metrology device for example. The dryer may be part of a bath type or all wet immersion system, as described above, where immersion liquid is not confined to a portion of the substrate, but may flow over substantially all of the surface of the substrate. In the dryer, the droplet remover removes liquid present on the surface of a substrate. In an embodiment the drying may occur after exposure of the substrate is complete and before the substrate leaves the lithographic apparatus for processing elsewhere, for example, at a track for development, coating, baking and etching. In an embodiment the drying occurs after exposure in a separate unit outside the lithography apparatus. The drying may occur after measurement in a metrology system where immersion liquid is used to replicate an immersion environment.

To operate the dryer, the dryer may be passed over a substrate that has been removed from the immersion system and/or the substrate may be passed under the dryer. In an embodiment, the dryer is used with respect to the substrate once immersion liquid has been drained from the immersion system and/or the liquid supply to the immersion system has stopped. The liquid covering the substrate may break from a film to form many droplets. As the dryer is used with respect to the substrate surface, liquid present on the substrate is removed, drying the surface.

An embodiment of the invention provides a device manufacturing method in which an image of a pattern is projected onto a substrate through an immersion liquid confined to a space adjacent the substrate, and liquid is removed from the substrate in a two-phase flow with gas. The two-phase flow is separated into a first flow and a second flow, the first flow having a higher ratio of liquid to gas than the two-phase flow and flowing along a surface, the second flow having a higher ratio of gas to liquid than the two-phase flow. The steps of projecting and removing can be carried out simultaneously or the step of removing can be carried out after the step of projecting has been carried out.

Figure 8:
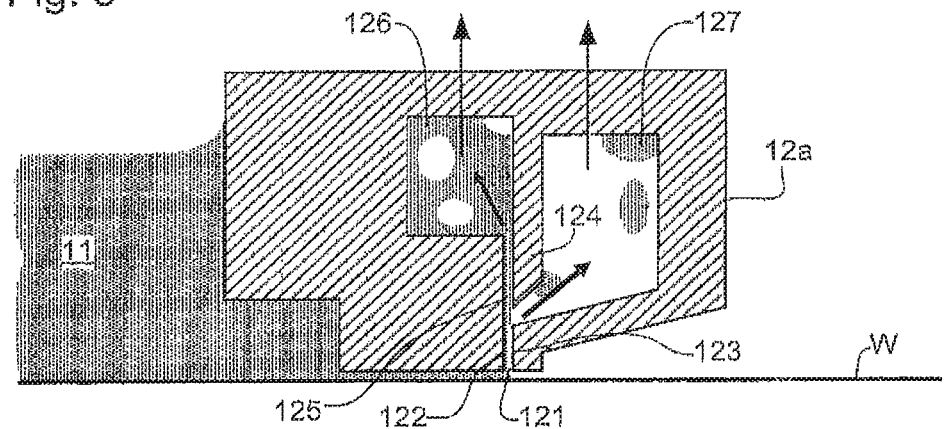
FIG. 8 depicts, in cross-section, an arrangement in a barrier member forming part of a fluid handling structure according an embodiment of the invention.

FIG. 8 is a cross-section of a part of a barrier member 12a of a fluid handling structure according to an embodiment of the present invention. The barrier member 12a assists in confining an immersion liquid 11 to a space between the final element of the projection system PS and the substrate W. Although only one side of the barrier member 12a is shown, it can be arranged to surround completely the localized immersion liquid 11, for example being in the form of an annulus. Also, although shown as having a vertical inner wall with a step, the inner wall may have other shapes, for example slanted as shown in FIG. 7, and in particular may conform to the contour of the lower part of the projection system PS.

As shown in FIG. 8, there is a narrow gap between the lower surface of barrier member 12a and substrate W through which the immersion liquid can escape. In an embodiment this gap may be made as narrow and as long as possible to reduce or minimize the escape of immersion liquid. Any liquid that does escape is extracted via opening 121. Opening 121 is connected to an underpressure and draws in fluid, e.g. immersion liquid 11 as well as gas, e.g. air, from the local environment. Opening 121 may be a continuous slit extending completely around the localized area of immersion liquid 11 or a series of smaller slits together substantially surrounding the localized immersion liquid 11. For structural reasons, the opening 121 may be bridged at certain points by small connectors.

Opening 121 is defined by first wall 122 and second wall 123. First wall 122 is on the side of the region of immersion liquid 11. Immersion liquid 11 will tend to flow up that wall 122. The preferential flow of liquid 11 along first wall 122 can be encouraged by making first wall 122 have a smaller contact angle, e.g. smaller than 90 degrees (e.g., substantially smaller than 90 degrees), than second wall 123, e.g. by providing a coating or surface relief on first wall 122 or by selecting the material from which wall 122 is made. Similarly, second wall 123 can be made of a selected material, coated or treated to have a higher contact angle to the liquid 11. The preferential flow of immersion liquid 11 along wall 122 begins the separation of the liquid and gas entering opening 121. This separation can be fixed, or conserved, by directing the high liquid content and high gas content portions of the flow into respective different chambers.

This can be achieved in the embodiment of FIG. 8 by divider 124 which is positioned adjacent and substantially parallel to first wall 122 so as to define a channel, e.g. a capillary 125. Liquid 11 flowing up wall 122 enters channel 125 and then wet chamber 126. The width of channel 125, as well as the surface coating thereon if desired, encourages liquid to enter but not gas. In an embodiment, the width of channel 125 is in the range of from 0.5 mm to 3 mm, desirably 1 mm to 2 mm. The gas, which is more easily diverted, enters dry chamber 127 via a gap between divider 124 and second wall 123. Divider 124 does not need to be vertical: it can be oriented at other a different angle. Divider 124 can be formed by a microsieve (described further below) or a liquid-phobic porous membrane (described further below) to effect further separation by allowing movement of gas or liquid substantially only in one direction between the chambers. The end of divider 124 is shown as tapering in FIG. 8 however this end can instead be flat or rounded. If tapered or rounded, the tapering or rounding can be provided on either or both sides of the divider 124.

Wet chamber 126 and dry chamber 127 are connected to respective sources of under pressure, e.g. vacuum pumps (now shown). The sources extract the liquid-rich and gas-rich flows from the wet and dry chambers respectively and also provide the underpressure that draws the mixed two-phase flow into slit 121 in the first place. It is to be noted that the flow into wet chamber 126 and extracted therefrom may include some gas bubbles and similarly the flow of gas into dry chamber 127 and extracted therefrom may include some liquid droplets. It is not necessary that the separation of liquid and gas be perfect at this stage but sufficient separation to reduce the occurrence of uneven flow that may result in vibrations and/or reduce evaporation is desirable.

Figure 9:
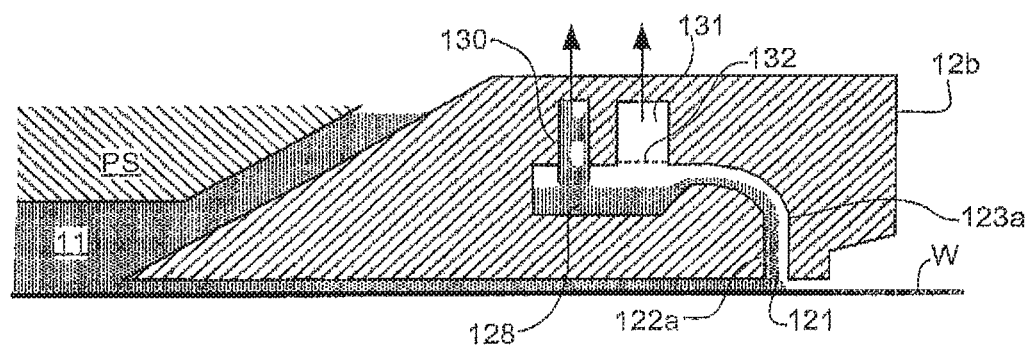
FIG. 9 depicts, in cross-section, a two-phase extraction arrangement in a barrier member forming part of a fluid handling structure according to a further embodiment of the invention.

A barrier member 12*b* according to an further embodiment of the present invention is shown in FIG. 9. As previously mentioned, barrier member 12*b* assists in confining an immersion liquid 11 to a space between a final element of projection system PS and substrate W. Some immersion liquid can leak through the gap between barrier member 12*b* and substrate W. Again the immersion liquid 11 and gas from the environment are drawn up into slit 121. Slit 121 is defined by wall 122*a* and 123*a* which are each configured to encourage separation of the two-phase flow entering slit 121 into a liquid-rich flow along first wall 122*a* and a gas-rich flow along wall 123*a*. In this embodiment, walls 122*a* and 123*a* are desirably curved so that slit 121 turns from being vertical at its entrance to being substantially horizontal or angled downwards at a point where it meets separation chamber 128. At this point first wall 122*a* forms the lower side of slit 121. Thus, gravity assists in keeping the liquid-rich flow along first wall 122*a*. As the liquid-rich and gas-rich flows enter separation chamber 128, the liquid and gas naturally tend to separate with the liquid occupying the lower part of the separation chamber 128. Desirably first wall 122*a* has a lower contact angle to the liquid 11 than second wall 123*a*. This can be achieved in the same ways as detailed above.

A liquid extraction opening is provided by liquid extraction conduit 130 which, in an embodiment, projects from the upper part of separation chamber 128 into the lower part and is connected to an under pressure (not shown) so as to extract liquid from the lower part of separation chamber 128. The level of the opening of the liquid extraction conduit 130 can be set so as to control the level of liquid in the separation chamber 128. Depending upon the level of liquid in the chamber 128, some gas may also be extracted. This can be reduced or minimized by providing a microsieve. A microsieve is a porous member. In an embodiment the microsieve may comprise a thin plate that has a large number of small holes through it. By suitable control of the underpressure above the microsieve, the size of the holes, and the liquid to be extracted, it can be arranged that substantially only liquid passes through the microsieve. The microsieve is desirably formed of a material having a contact angle to the immersion liquid of less than 90°, e.g. substantially less than 90°. By control of the underpressure above the microsieve and by ensuring that there is always liquid above the microsieve it is possible to prevent gas being extracted through the microsieve. Further details of such microsieves are given in United States patent application publication no. US 2006/0038968 A1, incorporated by reference in its entirety. Suitable microsieves are made by Stork Veco B.V. of the Netherlands.

To extract gas from the separation chamber 128, a gas extraction conduit 131 is provided in the upper surface of the chamber 128. The entrance to the gas extraction conduit 131 may be covered with a porous liquidphobic membrane 132, such as a thermally expanded fluoropolymer membrane. Suitable membranes are commercially available, e.g. under the trademark GORE-TEX®. If all the gas is extracted from the separation chamber through the membrane 132, the remainder of the fluid in the separation chamber is liquid and there may be no need for the above mentioned microsieve. If the separation chamber 128 is of suitable size and shape, the microsieve and porous liquidphobic membrane can be dispensed with and separation effected by positioning the liquid extraction opening in the bottom of the chamber 128 and the gas extraction opening part in the top of the chamber 128.

Figure 10:
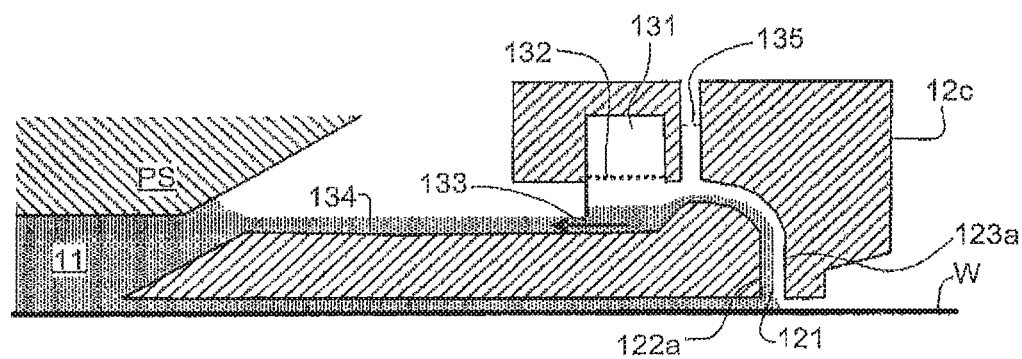
FIG. 10 depicts, in cross-section, a two-phase extraction arrangement in a barrier member forming part of a fluid handling structure according to a further embodiment of the invention.

FIG. 10 shows a further barrier member 12*c* that is a variation of the barrier member 12*b* shown in FIG. 9. In barrier member 12*c*, opening 121, formed by first and second walls 122*a*, 123*a*, is configured similarly to opening 121 in barrier member 12*b* of FIG. 9. Again, it feeds the separating flows into separation chamber 128 where the liquid content separates out at the bottom. Rather than being extracted via extraction conduit 130, an outlet 133 is provided near the bottom of the separation chamber 128 opening into a channel 134 that leads back to the space between the projection system PS and substrate W. This arrangement allows the immersion liquid to be recycled directly back to the space between the projection system and the substrate. This can reduce the consumption of the immersion liquid and also the volume of liquid flowing to and from the fluid handling structure. As in the structure of FIG. 9, gas is extracted from separation chamber 128 through gas extraction conduit 131 whose entrance may be covered by optional porous liquidphobic membrane 132. Also shown in FIG. 10 is a controlled leak 135 that provides a fluid communication between the local environment and the upper part of the slit 121 and/or separation chamber 128. This controlled leak 135 includes a flow restrictor and may be used to control the underpressure in slit 121 and separation chamber 128. Such a controlled leak 135 may also be employed in other embodiments of the invention.

In the embodiments described with reference to FIGS. 9 and 10, a substantially horizontal microsieve (as described above) may be used to divide the separation chamber into two parts and to substantially prevent gas entering into the lower, liquid-filled part. In the embodiment described with reference to FIG. 10, gas and liquid extraction conduits similar to conduits 131 and 133 shown in FIG. 9 can be provided to control the liquid level in chamber 128.

Figure 11:
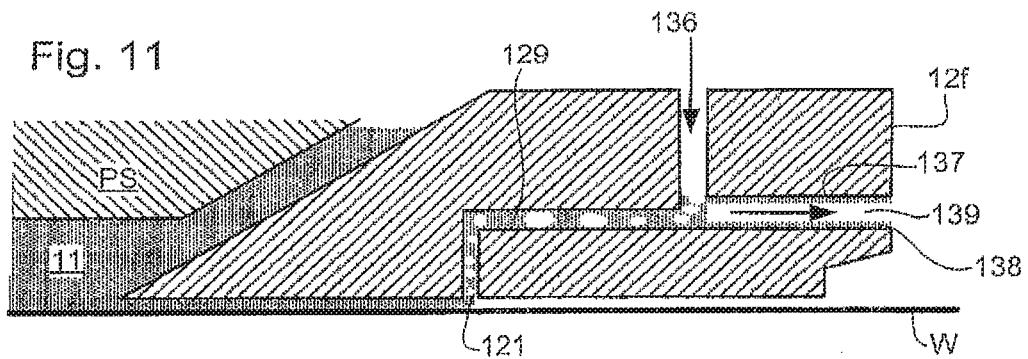
FIG. 11 depicts, in cross-section, a two-phase extraction arrangement in a barrier member forming part of a fluid handling structure according to a further embodiment of the invention.

A further barrier member 12*f* according to an embodiment of the invention is shown in FIG. 11. In this embodiment, immersion liquid 11 that passes along the gap between the barrier member 12*f* and the substrate W is drawn into opening 121 along with gas from the surroundings and so forms a two-phase flow in conduit 129. Additional gas is supplied from gas source 136 to increase the amount of gas in the two-phase flow which then enters conduit 137. This, and the resulting increased flow rate, encourages the two-phase flow to separate out in conduit 137. In conduit 137, the liquid flows in around the outside 138 of the conduit while the gas flows mainly down the center 139. The inner surface of conduit 137 can be modified to encourage this as described below with reference to FIGS. 14 to 17. In an embodiment, conduit 137 is wider than conduit 129.

Arrangements to divert the separated flows as described below with reference to FIGS. 19 and 20 can also be used. The additional gas supplied from gas supply 136 need not be the same as the gas taken up through opening 121. The additional gas can be taken from the surroundings of the apparatus by a pump or can be a pressurized gas supply. Such an additional gas supply can be used in other embodiments of the invention if desired.

Figure 12:
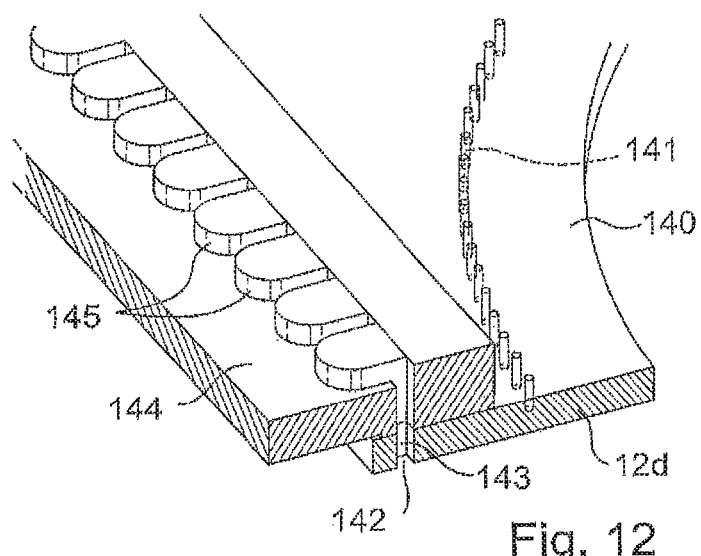
FIG. 12 depicts, in perspective and partly cut-away, a two-phase extraction arrangement in a barrier member forming part of a fluid handling structure according to a further embodiment of the invention.

A barrier member according to a further embodiment of the invention is shown in FIG. 12 in a partially-cut away perspective view. Shown in the Figure is the lower plate 140 of the barrier member 12d. Lower plate 140 is provided with a ring of small through-holes 141 through which the immersion liquid is supplied to the space between the projection system PS and the substrate W and a set of extraction ports 142 (only one directly visible in the Figure). A two-phase fluid flow comprising liquid flowing underneath the bottom plate 140 and gas from the local environment is extracted through the extraction ports 142. The extraction ports 142 lead to vertical channels 143 through the body of the barrier member 12d. At their tops, the channels 143 open into a generally horizontal separation chamber 144. Between adjacent conduits 143, flow guiding structures 145 are provided. The flow guiding structures have curved surfaces. With curved surfaces the flow guiding structures 145 are generally semi-circular or semi-oval in plan. They are spaced apart so that passageways with diverging or widening walls are defined between the top ends of the conduit 143 and the main part of the separation chamber 144. The passageways widen with an increase in the distance from the top ends of the conduit 143. Omitted from FIG. 12 is an upper surface in which may be defined openings for the exit of liquid and gas from the separation chamber 144. The upper surface may be an upper plate of the barrier member 12b. The upper plate may close the separation chamber 144. The openings in the upper surface define openings of liquid and gas extraction channels. In an embodiment, a single opening in the upper plate may be used. In this case the liquid and gas are arranged to flow separately in a single channel.

In use, the two-phase flow from the gap between the barrier member 12d and the substrate W flows up channels 143. The flow then undergoes a sharp change of direction to flow horizontally into the separation chamber 144. This sharp change of direction causes the liquid to preferentially flow along a surface of the separation chamber, such as the underside of the upper plate which closes the upper side of the separation chamber 144. The liquid flow thus separates from the mixed two-phase flow. The liquid flow leaves the remaining fluid, i.e. the gas, to flow as a gas flow.

Flow guiding structures 145 initially confine the flow exiting the channels 143. The flow guiding structures 145 guide the two-phase flow away from the channels 143. As the passageways between the flow guiding structures widen with increasing distance from the channel 143, the surface area of the passageways increases. With increasing passageway surface area, more of the liquid is drawn to flow along the surface of the separation chamber 144. The flow guiding structures 145 in effect allow the two-phase flow to spread out as it moves towards the center of the separation chamber 144. Thus with increasing distance from the channel 143 the separation of the phases in the two-phase flow improves.

The flow guiding structures 145 may guide the gas and liquid flows (i.e. separated two-phase flow) to an opening. The two-phase flow leaves the separation chamber as a separated two-phase flow, or as separated flows of liquid and gas. Note that the opening through which the fluid exits the separation chamber 144 is desirably located in the upper surface. The opening may be defined in a surface of the chamber, for example in a non-limiting list: a lower surface of the chamber, a side surface defining a side of the chamber or a surface of the flow guiding structure 145.

Figure 13:
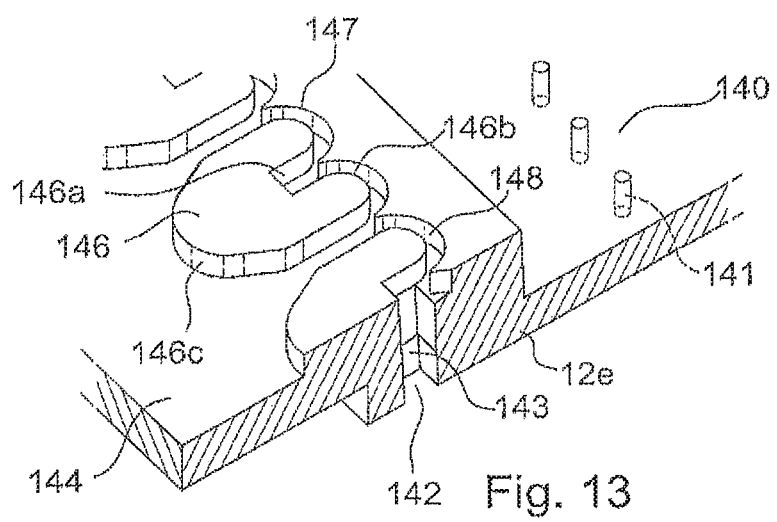
FIG. 13 depicts, in perspective and partly cut-away, a two-phase extraction arrangement in a barrier member forming part of a fluid handling structure according to a further embodiment of the invention.

FIG. 13 is a partially cut-away perspective view of another barrier member 12e according to an embodiment of the invention. Note that the features shown in FIG. 13 are enlarged compared to those shown in FIG. 12. The barrier member 12e of FIG. 13 differs from barrier member 12d of FIG. 12 in the shape and configuration of the flow guiding structures 145, which are labeled as flow guiding structures 146.

In FIG. 13, flow guiding structures 146 have, in plan, a projection on either side of an opening of the top of conduit 143. Each projection may be a lobe with a curved surface. In plan, the flow guiding structure 146 may be bilobed, with a recess between the lobes. The opening of the conduit may be located between the lobes and may be in the recess. The adjoining, or inner, walls of each lobe of the bilobed structure may meet to define a wall defining in part the opening to the conduit 143. The outer wall 146b of the lobes of each bilobed structure define the remaining shape of the flow guiding structure. The outer wall of the lobes may converge to form a third lobe directed away from the bilobed structure. The outer wall of the lobes near the third lobe may be a converging or tapering part of the flow guiding structure. In an embodiment the flow guiding structure may be described as heart-shaped. The conduit 143 may open into the recess, which may be a cusp 146a of the heart-shape.

A wall 147 of the separation chamber 144 opposing the lobes are shaped to correspond with the lobes. The shape of the wall defines a recess. Each recess is shaped (e.g., curved) away from the corresponding flow guiding structure 146. Adjoining recesses meet, in plan, at a point. The point may be an edge. A point may be opposed to the opening of a conduit 143, i.e. the wall of the flow guiding structure, between two lobes.

In use of the apparatus, the two-phase flow from conduit 143 is directed along passageway 148. The passageway 148 is defined by a lobe of flow guiding structure 146 and a corresponding recess in the wall of the separation chamber. The passageway may be curved. The two phase flow may follow a curved path along passageway 148. In the passageway 148, the two-phase flow may separate as it changes direction. The two-phase flow may start to separate at this stage. The curved path of the two-phase flow changes direction which in an embodiment may be by substantially 180 degrees. The two phase fluid may then flow towards the main part of the separation chamber 144, and may be towards the tapering part.

The sharp change of direction on exit of the flow channel 143 combines with a cyclonic effect generated by the movement of the flow through passageway 148 to cause the two-phase flow to start to separate (or in an embodiment separate) the two-phase fluid flow into separated flows of liquid and gas. As the two-phase fluid flows along the passage between adjacent flow guiding structures 146, the phases of the two-phase flow may continue to separate. Towards the tapering part 146c, the walls of a passage between the adjacent flow guiding structures 146 diverge. The passage widens. The surface area over which the two-phase flow flows increases to allow the fluid to spread out. As the phases of the fluid have started to separate into liquid and gas, the increase in surface area may encourage the separation to increase. The two-phase flow may be extracted through openings of extraction channels defined in an upper surface, for example in the upper plate (not shown) of the barrier member 12e. The two-phase flow may be extracted through a single opening as a flow in which the phases flow separately.

In an embodiment of the invention, it may be necessary to transport a two-phase flow through a conduit which may be substantially circular in cross-section. In order to help prevent uneven mixed two-phase flow, which may cause vibrations, it is desirable to separate the liquid and gas within the conduit which may be circular. In an embodiment of the invention, the liquid content of the two-phase flow is encouraged to adopt an annular flow (i.e. annular two-phase flow) in an axial direction of the conduit, radially outwardly from the gaseous flow. That is the liquid may flow along the outside inner surface of the conduit while the gas flows substantially along the middle of the conduit. This can be achieved with an appropriate coating and/or structure in or on the inner surface of the conduit.

FIG. 14 is a cross-sectional view of a circular cross-section conduit having no particular surface treatment. There is a relatively high contact angle between the liquid 11 and the wall of the conduit 150. Under the influence of gravity (if sufficiently stronger relative to the forces applied to the fluid to cause it to flow through the conduit) the liquid tends to flow along the bottom of the conduit 150. The liquid may accumulate into larger bodies filling the entire cross-section of the conduit. Such a cross-sectional blockage disrupts the smooth flow of the fluid, resulting in uneven flow, which may be referred to as plug-slug flow. In an embodiment of the invention, shown in FIG. 15, a liquidphilic coating 151 is on the interior wall of the conduit 150 (i.e. a surface portion which may be treated which has a reduced contact angle relative to the surrounding surface). This reduces the contact angle between the liquid 11 and the wall of the conduit 150 (i.e. at the surface portion). The liquid is caused to spread out over the interior surface of the conduit 150, for example the bottom of the conduit 150, into a liquid layer. The liquid layer reduces the tendency for the liquid 11 to form into a slug filling a cross-sectional portion of the conduit. Vibration caused by the flow may be reduced.

In an embodiment, shown in FIG. 16, liquidphilic surface relief pattern 152 is formed on the interior wall of the conduit 150. As well as encouraging the liquid 11 to spread out more widely on the part of the conduit 11, this pattern 152 forms one or more pathways along which a small stream of liquid can flow, again reducing the tendency of the liquid 11 to form a slug.

In an embodiment, a liquidphobic (increased contact angle) surface relief pattern may achieve a similar outcome. The patterning (whether liquidphobic or liquidphilic) may be formed by a coating of material on the conduit, a surface relief of the conduit, a physical structure such as a projection or groove, or a combination of any of these features. The patterning may have a coiled pattern. The patterning may be applied to an untreated surface, so that where the patterning is not applied, an adjustment or change to the contact angle of the surface does not occur. In an embodiment the effective surface is between patterned features. In an embodiment the entire surface of the conduit may be a surface with adjusted contact angle; liquidphobic and liquidphilic patterning may be present in combination.

In an embodiment of the invention, a helical structure may be formed on the inside of the conduit 150. This helical structure can take one or a combination of forms. For example, as shown in FIG. 17, a helical groove 153 can be formed on the interior wall of the conduit 150, similarly to rifling in a gun barrel. As shown in FIG. 18, a helical projection 154, e.g. wire, can be located substantially on the interior surface of the conduit. (In the case of wire, the wire can be inserted into the conduit). The projection 154 may be made of, or coated with, a liquidphilic material. Alternatively or additionally, not illustrated, the helical ridge (i.e. projection) is located on the interior wall of the coating. In each case, the helical structure encourages the liquid 11 to flow in an annulus against the interior wall of the conduit 150. The depth or height of the groove, coil or ridge, its pitch and number of starts can be selected based on the expected flow rates of liquid and gas in the two-phase flow. In an example, a 6 mm (internal diameter) hose was provided with an internal spring of stainless steel wire of diameter 0.5 mm having a pitch of 6 mm±2 mm. This arrangement may be effective in providing smooth flow at a water ratio of about 1:250. In an embodiment the pitch of the helical structure is greater than 50% of the diameter of the conduit. In an embodiment the pitch of the helical structure is substantially equal to or grater than the diameter of the conduit.

Having separated the two-phase flow within conduit 150 into annular flow or (where the two-phase flow is supplied as annular flow) maintaining the annular flow, it is desirable to fix or conserve that separation by diverting the liquid and gas into separate conduits. Two-phase annular flow may be supplied from a fluid handling structure shown in and described with reference to FIGS. 12 and 13. So conduit 150 may be connected to openings though which fluid exits separation chamber 144.

Two arrangements to help achieve fixation of the phase flow separation are shown in FIGS. 19 and 20. In FIG. 19, a part 155 of the wall of the conduit 150 is formed of a microsieve as described above. As mentioned above, a microsieve may be a thin metal plate having a large number of small holes formed therein, the size of the holes being determined so that desirably only liquid passes through, especially if the space on the other side of the sieve is filled with liquid. In this way, the liquid can be extracted from conduit 150 while the gas continues to flow down conduit 150. In FIG. 20, a smaller tube 156 is inserted into the center of conduit 150 so that the gas flowing down the middle of conduit 150 enters the smaller tube 156 and can therefore be separated from the liquid which preferentially flows around the interior wall of the conduit 150. This arrangement can of course be combined with the microsieve arrangement of FIG. 19.

Figure 21A:
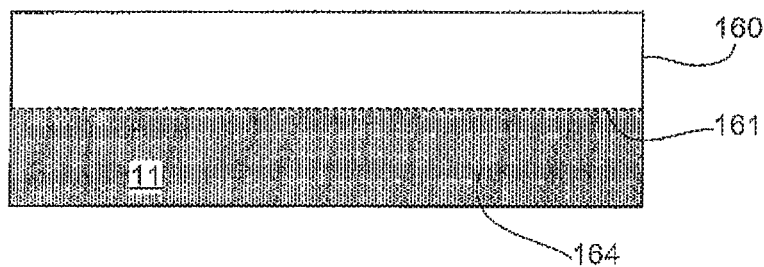
FIGS. 21A to 21D depict a liquid-gas separator usable in an embodiment of the invention.
Figure 21B:
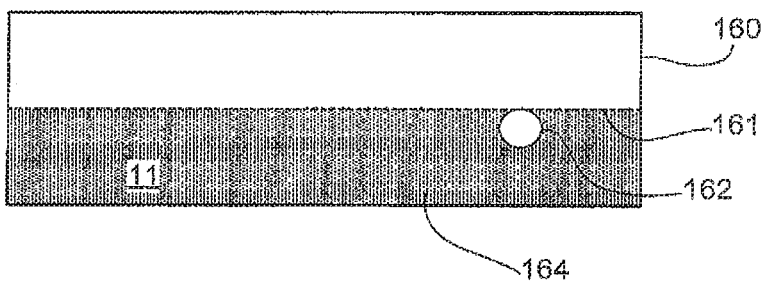
Figure 21C:
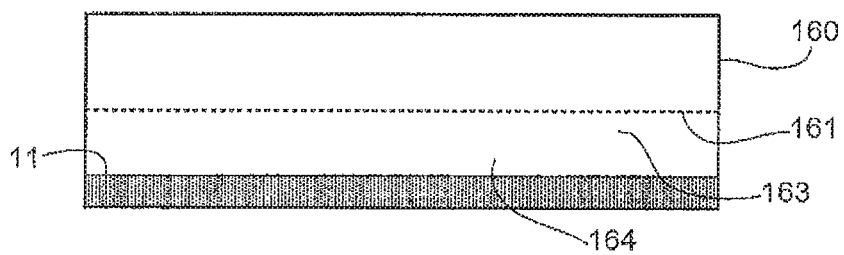
Figure 21D:
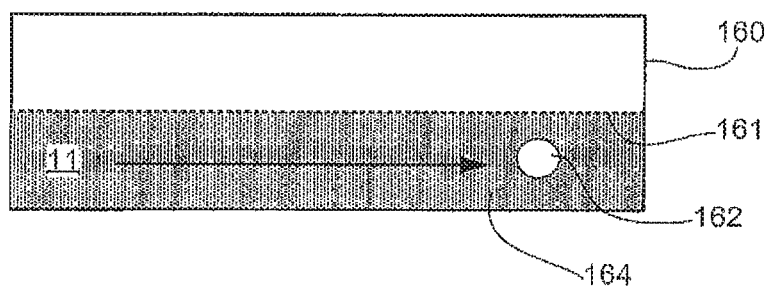

FIGS. 21A-D relate to a problem, and a solution therefor, that can occur with the use of a microsieve to separate liquid and gas, as described with reference to FIGS. 8 and 9. FIG. 21A shows a conventional situation in which a microsieve 161 is used to separate or remove liquid 11 from gas in a volume such as chamber 160. Chamber 160 is, for example, connected to a gap defined between the surface of a substrate table and the surface of a substrate (commonly known as a substrate bubble extraction system) or adjacent a restricted space, such as the underside of a fluid handing structure 12. The microsieve 161 separates chamber 160 from a volume e.g. an extraction conduit 164. The extraction conduit 164 is filled with liquid. Through the extraction conduit 164, liquid extracted through the microsieve 161 may be removed. If an underpressure is applied to the extraction conduit 164 so as to withdraw the liquid 11 through the microsieve 161 but no additional liquid enters the chamber 160, a situation as shown in FIG. 21B, C can arise. What happens is that a bubble 162 may begin to develop on the surface of the microsieve 161 within the extraction conduit 164 as the underpressure in the extraction conduit 164 increases. Once that bubble has formed, the surface tension effect that normally prevents gas passing through the microsieve 161 ceases to operate locally and the bubble 162 may quickly expand to form a gas layer 163 adjacent the microsieve 161 within the extraction conduit 164, as shown in FIG. 21C. In this situation, additional liquid entering the chamber 160 can become trapped within the chamber 160. Gas instead of liquid may enter the extraction conduit 164.

According to an embodiment of the invention, a solution is to provide a current within the liquid 11 in the conduit 164. The current may flow in a direction with a component which is perpendicular to the plane of microsieve 161, for example in the surface of the microsieve in which defines in part the conduit 164. Desirably, the current may be substantially perpendicular to the plane of the microsieve 161. This current may be achieved by supplying additional liquid in one part of the extraction conduit 164 and extracting it in another part or simply by setting up a recirculating flow of the liquid within the extraction conduit 164. The flow within the liquid 11 causes a bubble 162 to detach from the microsieve 161 before it can expand. The surface tension effect limiting the passing of gas through the microsieve is maintained. This arrangement can result in small bubbles entering into the liquid in the extraction conduit 164 through the microsieve 161. However this is generally less undesirable than formation of a complete gas layer below the microsieve 161.

The embodiments described above provide various different arrangements for at least partially separating two-phase flow into separate flows: one with a relatively high liquid content (liquid-rich), one with a relatively low liquid content (gas-rich). Complete separation into liquid and gas flows is not necessary; sufficient separation to reduce vibration and/or evaporative cooling is desirable. Separation may occur in a single chamber or conduit. Subsequently such separation can be substantially fixed by directing the separate flows into separate chambers or conduits.

Separation of a two-phase flow can occur in stages. The liquid-rich and/or gas rich flows generated by any of the embodiments described above may be provided as input(s) to a separator or separator(s) of any of the other embodiments, or to another similar stage. In this way increasingly complete separation can be achieved. In particular, an output of separation as described with reference to any of FIGS. 8 to 13 may be conveyed and/or further separated by an arrangement as described with reference to any of FIGS. 15 to 21D.

An embodiment of the present invention may be applied to any two-phase flow. In an immersion lithographic apparatus, particular sources of two-phase flows to which an embodiment of the invention may be used to separate include: a dryer; a droplet or film removal device; and/or a bubble extraction device (e.g., to extract liquid and gas from gaps between or below a substrate, a sensor or a closing disk and the substrate table or between a substrate table and a swap bridge or a measurement stage, or a gap between a barrier member and a substrate or substrate table, or a gutter on a substrate table).

It may be desirable to effect separation of a two-phase flow as close to its source as possible. Thus, the phase separation according to an embodiment of the invention may be incorporated in a barrier member, a substrate table, an extraction conduit, a swap bridge or a measurement stage.

In an embodiment of the invention, the effectiveness of the separation can sometimes be improved by control of flow rates and pressures in various parts of the apparatus. Such control may be effected by a suitable control system connected to sources of underpressure, sources of liquid and/or gas, and controllable valves, for example. The control system may be embodied in software, hardware or a combination of software and hardware. A control system may be responsive to servos and or control systems of other parts of the apparatus so as to anticipate or respond to conditions and actions of other parts of the apparatus that might affect the two-phase flow.

In an aspect, there is provided a lithographic apparatus comprising a substrate table constructed to hold a substrate, and a fluid handling structure arranged to remove liquid and gas in a two-phase flow from a surface of the substrate table, or of a substrate held by the substrate table, or both the substrate table and the substrate, the fluid handling structure comprising a phase separator having a surface and arranged to separate the two-phase flow into a first flow and a second flow, the first flow having a higher ratio of liquid to gas than the two-phase flow and flowing along the surface, the second flow having a higher ratio of gas to liquid than the two-phase flow. Optionally, the phase separator comprises a channel having first and second walls and arranged so that liquid preferentially flows along the first wall, the first wall defining the surface. Optionally, the first wall has a lower contact angle than the second wall. Optionally, the phase separator further comprises a wet chamber arranged so that liquid flowing along the first wall enters the wet chamber. Optionally, the wet chamber is connected to the channel by a slit defined by the first wall and a divider. Optionally, the first wall is substantially straight between an inlet of the channel and the wet chamber. Optionally, the slit has a width arranged so that capillary forces encourage substantially only liquid to enter the slit, desirably the slit width is in the range of from 0.5 mm to 3 mm, desirably from in the range of from 1 mm to 2 mm. Optionally, the first wall is curved so that at a point where the channel enters the wet chamber the first wall is lower than the second wall. Optionally, the phase separator further comprises a gas extraction channel separated from the wet chamber by a gas-permeable liquid-phobic membrane. Optionally, the phase separator further comprises a liquid extraction opening defined in a wall of the wet chamber, the liquid extraction opening being below the gas-permeable liquidphobic membrane. Optionally, the phase separator further comprises a drain path to allow liquid to drain from the wet chamber to a space between the substrate and a projection system arranged to project a patterned radiation beam onto the substrate. Optionally, the phase separator further comprises a dry chamber connected to the channel via an opening in the second wall. Optionally, the phase separator comprises a chamber, defined by first and second walls, and a plurality of channels entering into the chamber through the second wall, the channels being arranged at an angle to the second wall such that a two-phase flow entering the chamber from a channel at least partially separates into a liquid flow along the first wall and a gas flow along the second wall. Optionally, the phase separator further comprises a plurality of flow directing structures in the chamber adjacent the openings of the channels. Optionally, the flow directing structures have curved surfaces that define flow paths leading away from the openings, the flow paths increasing in width away from the openings over at least part of their length. Optionally, the curved surfaces are arranged so that the flow paths turn through at least 90°, desirably 180°. Optionally, the phase separator comprises a liquidphilic surface, desirably the liquidphilic surface is in a conduit. Optionally, the liquidphilic surface is a liquidphilic coating. Optionally, the liquidphilic surface has a liquidphilic surface relief provided thereon. Optionally, the phase separator comprises a conduit defined by a wall and having a substantially circular cross-section over at least a part of the length thereof and a substantially helical structure provided on the wall. Optionally, the substantially helical structure is a substantially helical groove in the wall, or a substantially helical wire mounted on the wall, or a contact angle surface patterning which is helical, or any combination selected therefrom. Optionally, the substantially helical structure has a liquidphilic coating. Optionally, the phase separator further comprises a gas extraction conduit arranged within a part of a conduit so as to define an annular gap between an outer surface of the gas extraction conduit and an inner surface of the conduit. Optionally, the surface is in part defined by a porous member, desirably a plate, through which liquid can be extracted. Optionally, the phase separator further comprises a gas supply arranged to add additional gas to the two-phase flow. Optionally, the fluid handling structure comprises a barrier member arranged to at least partly confine a liquid to a space between the substrate and a projection system arranged to project a patterned radiation beam onto the substrate, the phase separator being contained in the barrier member.

In an aspect, there is provided a fluid handling structure configured to remove liquid and gas in a two-phase flow from a surface, the fluid handling structure comprising a phase separator having a surface and arranged to separate the two-phase flow into a first flow and a second flow, the first flow having a higher ratio of liquid to gas than the two-phase flow and flowing along the surface, the second flow having a higher ratio of gas to liquid than the two-phase flow.

In an aspect, there is provided a drying device comprising the above fluid handling structure.

In an aspect, there is provided an immersion metrology device comprising the above fluid handling structure.

In an aspect, there is provided a device manufacturing method comprising projecting an image of a pattern onto a substrate through a liquid confined to a space adjacent the substrate, removing liquid from the substrate in a two-phase flow with gas, and separating the two-phase flow into a first flow and a second flow, the first flow having a higher ratio of liquid to gas than the two-phase flow and flowing along a surface, the second flow having a higher ratio of gas to liquid than the two-phase flow. Optionally, the projecting and removing are carried out simultaneously. Optionally, the removing is carried out after the projecting has been carried out.

In an aspect, there is provided a liquid-gas separator comprising a conduit or chamber divided into two parts by a porous plate, the first part being substantially filled with liquid, and a current generator configured to supply liquid to the first part and constructed and arranged to generate a current in the liquid so as to substantially prevent bubbles of gas remaining on a surface of the porous plate which defines in part the first part.

In an aspect, there is provided an apparatus having an immersion system with the above separator, wherein the apparatus is a lithographic apparatus or a metrology device.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid outlets, one or more gas outlets, one or more fluid outlets for two-phase flow, one or more gas inlets, and/or one or more liquid inlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

It should be noted that the term "gas knife" should not be taken as requiring that a specific gas is necessarily used, any gas or mixture of gases may be used.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a projection system configured to project a radiation beam onto a radiation-sensitive substrate;
a movable table; and
a fluid handling structure configured to remove a fluid comprising a combination of liquid and gas, the fluid handling structure comprising a barrier member arranged to at least partly confine a liquid to a space between the movable table and the projection system, the barrier member comprising:
an opening to remove the fluid,
a porous member internal to the barrier member and facing toward the table, the porous member located downstream of, and apart from, the opening and the porous member configured to receive a part of the removed fluid separate from a remainder of the removed fluid within the barrier member, and
a conduit to discharge the remainder of the removed fluid.

2. The lithographic apparatus of claim 1, wherein the porous member is part of a duct to discharge the part of the removed fluid and the porous member is essentially liquid impermeable.

3. The lithographic apparatus of claim 1, wherein the porous member is part of a duct to discharge the part of the removed fluid and the porous member is essentially gas impermeable.

4. The lithographic apparatus of claim 1, further comprising a chamber within the barrier member, the interior of the chamber having an opening of the conduit and an opening of a duct to discharge the part of the removed fluid.

5. The lithographic apparatus of claim 4, wherein the opening of the duct is lower than the opening of the conduit.

6. The lithographic apparatus of claim 4, wherein at least part of the duct protrudes into the chamber.

7. The lithographic apparatus of claim 4, further comprising a liquid-phobic surface in the interior of the chamber.

8. The lithographic apparatus of claim 4, wherein the opening of the duct and the opening of the conduit are in, or attached to, an upper wall of the chamber.

9. The lithographic apparatus of claim 4, further comprising a plurality of horizontal flow directing structures in the chamber.

10. A lithographic apparatus comprising:
a projection system configured to project a radiation beam onto a radiation-sensitive substrate;
a movable table; and
a fluid handling structure arranged to remove a fluid comprising a combination of liquid and gas, the fluid handling structure comprising a barrier member arranged to at least partly confine a liquid to a space between the movable table and the projection system, the barrier member comprising:
an opening to remove the fluid,
a chamber, internal to the barrier member, arranged to receive the removed fluid, the chamber having a generally horizontal wall in the interior of the chamber,
a gas discharge opening in the chamber, the gas discharge opening configured to discharge primarily gas, and
a separate liquid discharge opening in the chamber, the liquid discharge opening configured to discharge primarily liquid.

11. The lithographic apparatus of claim 10, wherein the liquid discharge opening is located at a distal end of at least part of a discharge channel protruding into the chamber.

12. The lithographic apparatus of claim 10, wherein the liquid discharge opening comprises a porous member.

13. The lithographic apparatus of claim 10, wherein the gas discharge opening and the liquid discharge opening are in, or attached to, the generally horizontal wall of the chamber.

14. The lithographic apparatus of claim 10, wherein the liquid discharge opening is lower than the gas discharge opening.

15. The lithographic apparatus of claim 10, wherein the interior of the chamber has a length in the horizontal larger than a width in the vertical.

16. The lithographic apparatus of claim 10, further comprising a liquid-phobic surface in the interior of the chamber.

17. A lithographic apparatus comprising:
a projection system configured to project a radiation beam onto a radiation-sensitive substrate;
a movable table; and
a fluid handling structure arranged to remove a fluid comprising a combination of liquid and gas, the fluid handling structure comprising a barrier member arranged to at least partly confine a liquid to a space between the movable table and the projection system, the barrier member comprising:
an opening to remove the fluid,
a chamber, internal to the barrier member, arranged to receive the removed fluid,
a first discharge opening in the chamber, and
at least part of a discharge channel protruding into the chamber and having a second discharge opening at a distal end thereof, the discharge channel comprising a porous member.

18. The lithographic apparatus of claim 17, wherein the first discharge opening is configured to discharge primarily gas and the second discharge opening is configured to discharge primarily liquid.

19. The lithographic apparatus of claim 17, wherein the at least part of the discharge channel protrudes down from an upper wall of the chamber.

20. The lithographic apparatus of claim 19, wherein the first discharge opening is located at the upper wall.

21. A lithographic apparatus comprising:
a projection system configured to project a radiation beam onto a radiation-sensitive substrate;
a movable table; and
a fluid handling structure arranged to remove a fluid comprising a combination of liquid and gas, the fluid handling structure comprising:
a barrier member arranged to at least partly confine a liquid to a space between the movable table and the projection system, the barrier member comprising an opening through which the fluid is removed, and a discharge conduit arranged to receive the removed fluid, the discharge conduit comprising a porous member on opposite sides of a flow path of the removed fluid through the discharge conduit, wherein primarily liquid from the removed fluid passes through the porous member and primarily gas continues to flow along the flow path.

* * * * *